(12) United States Patent
Liebmann et al.

(10) Patent No.: US 7,346,887 B2
(45) Date of Patent: Mar. 18, 2008

(54) METHOD FOR FABRICATING INTEGRATED CIRCUIT FEATURES

(75) Inventors: Lars W. Liebmann, Poughquag, NY (US); Jochen Beintner, Gomadingen (DE)

(73) Assignee: International Business Machines Corporation, Armonk, NY (US)

( * ) Notice: Subject to any disclaimer, the term of this patent is extended or adjusted under 35 U.S.C. 154(b) by 287 days.

(21) Appl. No.: 11/164,076

(22) Filed: Nov. 9, 2005

(65) Prior Publication Data

US 2007/0106972 A1    May 10, 2007

(51) Int. Cl.
*G06F 17/50*    (2006.01)
(52) U.S. Cl. .............. 716/21; 716/19; 716/20
(58) Field of Classification Search ............ 716/19–21; 430/5
See application file for complete search history.

(56) References Cited

U.S. PATENT DOCUMENTS

| | | | |
|---|---|---|---|
| 4,919,768 A | 4/1990 | Bladon | |
| 5,342,501 A | 8/1994 | Okabayashi | |
| 6,083,275 A * | 7/2000 | Heng et al. ................... 716/19 |
| 6,506,293 B1 | 1/2002 | Rumpf | |
| 6,440,839 B1 | 8/2002 | Partovi et al. | |
| 6,653,231 B2 | 11/2003 | Okoroanyanwu et al. | |
| 6,660,154 B2 | 12/2003 | Merricks et al. | |
| 6,713,396 B2 | 3/2004 | Anthony | |
| 6,795,961 B2 * | 9/2004 | Liebmann et al. ............ 716/19 |
| 6,901,576 B2 * | 5/2005 | Liebmann et al. ............ 716/19 |
| 7,100,134 B2 * | 8/2006 | Wu et al. ....................... 716/5 |
| 7,249,342 B2 * | 7/2007 | Pack et al. .................... 716/20 |
| 2001/0040267 A1 | 11/2001 | Lien et al. | |
| 2003/0203636 A1 | 10/2003 | Anthony | |
| 2004/0038513 A1 | 2/2004 | Kohl et al. | |

* cited by examiner

*Primary Examiner*—Vuthe Siek
(74) *Attorney, Agent, or Firm*—Lisa U. Jaklitsch

(57) ABSTRACT

The present invention is directed to a method for conversion of an integrated circuit design into a set of masks for fabrication of an integrated circuit that optimizes use of an edge based image transfer mask process.

28 Claims, 21 Drawing Sheets

US 7,346,887 B2

METHOD FOR FABRICATING INTEGRATED CIRCUIT FEATURES

BACKGROUND OF THE INVENTION

1. Field of the Invention

The invention relates generally to integrated circuit fabrication and, more particularly, to methods for conversion of an integrated circuit pattern into mask sets that optimize fabrication of said integrated circuit through an edge based pattern transfer process.

2. Description of the Related Art

The integrated circuit ("IC") industry strives for electronic devices that are both faster and infinitely smaller. Accordingly, the IC industry is driven by a demand for methods of fabricating IC features with improved dimensional control. IC fabrication with improved dimensional control creates ever smaller IC features, which in turn increases the circuit density of the IC. Increased circuit density yields higher chip performance. Therefore, a substantial economic advantage can be gained through the development of improved methods of fabricating IC features with improved dimensional control. Two prior art IC fabrication methods include optical lithography and sidewall image transfer ("SIT").

Optical lithography, one prior art IC fabrication method, comprises a patterning operation that sequentially modifies a semiconductor substrate and various films deposited on such substrate through the use of a light source. A layer of light sensitive polymer film, e.g. photoresist or resist, is coated onto the substrate followed by exposing the resist to the light source through a master stencil, i.e. photomask or mask. The mask includes patterned IC features, such as lines and spaces, that are transferred to the resist. After the resist is exposed, the optical lithography tool immerses the resist in solvent. The solvent defines the features that were transferred to the resist.

The prior art method of optical lithography is problematic because optical lithography tools are limited by the light source's wavelength. As IC features shrink to, for example, line widths of 45.0 nm, the inability of optical lithography to fabricate IC features with such diminutive line widths becomes increasingly problematic. In addition to fabricating infinitely smaller IC features, optical lithography must have the capability of creating IC features with increasing dimensional control. For example, the gate of a field effect transistor, one such feature fabricated through optical lithography, must be controlled to better than +/−10% of its nominal width. Diffraction effects, however, limit optical lithography's ability to deliver such dimensionally controlled IC features. The accuracy with which optical lithography renders IC features is inversely proportional to the resolution of the IC features being transferred. The IC features produced by optical lithography are limited to line widths greater than the minimum resolution of the optical lithography tool, which is ultimately limited by the wavelength ("λ") of the light source used by the optical lithography tool to expose the resist. For at least these reasons, optical lithography is deficient.

SIT, another prior art IC fabrication method, and further an edge based image transfer process, comprises depositing an etch-masking medium, e.g. nitride, on the sidewalls of a mesa, and removing the mesa, which leaves behind sidewall structures. The sidewall structures act as the primary image transfer medium for the patterning of narrow IC features.

While SIT has improved dimensional control over the prior art method of optical lithography, the prior art method SIT is problematic because only one IC feature size can be fabricated per SIT operation, only closed loop topographies can be created, and SIT has an incomprehensive IC feature shape library, in other words, only certain IC feature shapes can be fabricated with SIT. While dimensional control is important, sometime dimensional control is secondary to other considerations, e.g. larger feature size, chip performance, and cost. With SIT, if such other considerations become of primary importance, the IC designer must resort from SIT to optical lithography to create the desired IC feature. In addition to these considerations, SIT is disadvantageous because only a limited number of shapes, and more specifically closed loop shapes, can be created by SIT. The IC designer must resort from SIT to optical lithography whenever a shape must be fabricated that SIT cannot fabricate. Another reason that SIT is problematic is the challenge associated with the translation of the IC layout to the mask set required to exercise edge based imaging process. In sum, while SIT improves upon dimensional control, SIT does not entirely eliminate reliance on optical lithography. For at least these reasons, SIT alone is deficient. It should be noted that while SIT is an edge based image transfer process, alternating phase shift is another edge based image transfer process with the similar benefits and deficiencies of SIT.

What is needed in the art is an improved method for fabrication of integrated circuit that creates a final mask set that optimizes the use of an edge based image transfer mask based upon considerations such as dimensional control, chip performance, and cost and compensates for any deficiencies in creation of the integrated circuit with block and optical lithography masks.

BRIEF SUMMARY OF THE INVENTION

The present invention is directed to a method for converting an integrated circuit pattern into a plurality of masks that optimize an edge based image transfer process for fabrication of the integrated circuit. An edge based image transfer mask is generated for fabrication of an optimized number of edge based image transfer shapes in an integrated circuit pattern. Each integrated circuit pattern is comprised of a plurality of integrated circuit shapes.

According to a first embodiment of the invention, a block mask is generated for removal of any residual sections of the optimized number of edge based image transfer shapes and a lithography mask is generated for fabrication of any remaining integrated circuit shapes.

According to a second embodiment of the invention, a set of edge based image transfer shapes is selected in the plurality of integrated circuit shapes for the optimized number of edge based image transfer shapes in the integrated circuit pattern. Based upon errors in the generation of the edge based image transfer shapes, the set is iteratively reduced.

According to a third embodiment of the invention, a set of edge based image transfer shapes is selected in the plurality for the optimized number of edge based image transfer shapes in the integrated circuit pattern. Each edge based image transfer shape in the set comprises a binary edge based image transfer manufacture option. A most favorable edge based image transfer binary manufacture option is selectively chosen for each edge based image transfer shape. A final set of edge based image transfer shapes is thereby created.

According to a fourth embodiment of the invention, a set of edge based image transfer shapes is selected in the plurality for the optimized number of edge based image transfer shapes in the IC pattern and exclusion areas are defined around the set, substantially preventing expansion of edge based image transfer shapes that would cause at least partial IC failure in response to edge based image expansion.

The present invention optimizes use of edge based image transfer in cooperation with optical lithography for fabrication of an integrated circuit. In so doing, the present invention saves costs because dual features are created with edge based image transfer, improves upon circuit density because edge based image transfer process are created with tight dimensional control, and yet compensates for any deficiencies of the edge based image transfer process through continued reliance on optical lithography.

For at least the foregoing reasons, the invention improves upon fabrication of integrated circuits.

BRIEF DESCRIPTION OF THE DRAWINGS

The features and the element characteristics of the invention are set forth with particularity in the appended claims. The figures are for illustrative purposes only and are not drawn to scale. Furthermore, like numbers represent like features in the drawings. The invention itself, however, both as to organization and method of operation, may best be understood by reference to the detailed description which follows, taken in conjunction with the accompanying figures, in which:

DETAILED DESCRIPTION OF INVENTION

The invention will now be described with reference to the accompanying figures. In the figures, various aspects of the structures have been shown and schematically represented in a simplified manner to more clearly describe and illustrate the invention.

By way of overview and introduction, the present invention is directed to a method for conversion of an existing integrated circuit ("IC") design into a set of masks that optimize use of an edge based image transfer process for fabrication of an IC. An edge based image transfer mask is generated that fabricates an optimized number of edge shapes in the IC pattern. Then a block mask is generated that removes residual sections of the edge based image transfer mask. Finally, a lithography mask is generated for fabrication of any remaining IC shape in the IC pattern that cannot be generated through edge based image transfer. The present invention is a novel method that through an iterative process that selectively creates a set of masks that optimizes edge based image transfer for IC fabrication.

The preferred embodiment of the invention comprises optimization of an edge based image transfer process for creation of an IC in an effort to take advantage of the frequency doubling and improved dimensional control benefits associated with edge based image transfer. The preferred embodiment generates an edge based image transfer mask for an optimized number of edge shapes in an IC pattern comprising a plurality of IC shapes, a block mask for the removal of any residual sections on the edge shapes, and a lithography mask for the remaining IC shapes in the IC pattern.

Figure 2:
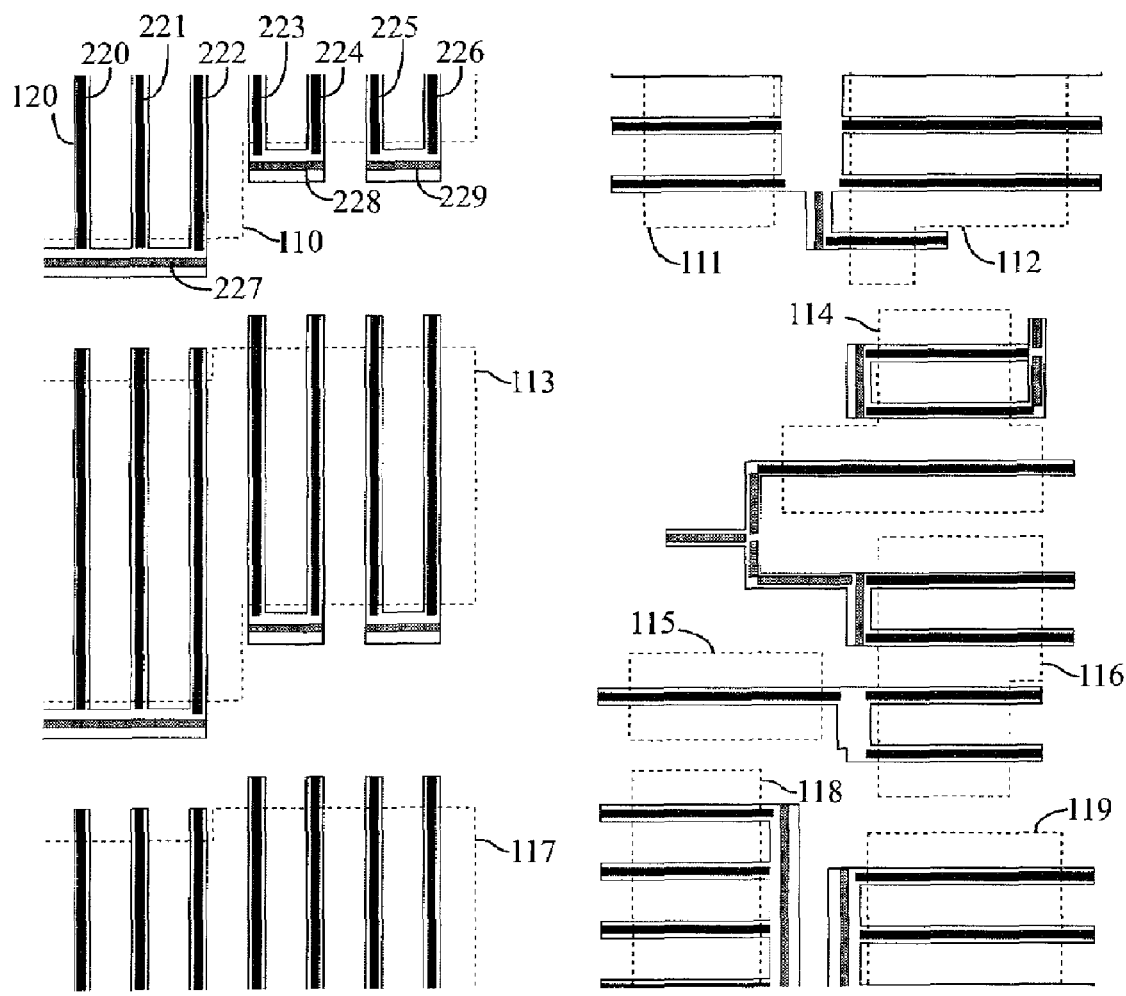
FIG. 2 depicts each IC shape in FIG. 1 divided into critical and non-critical centerline IC segments in accordance with the present embodiment.
Figure 3:
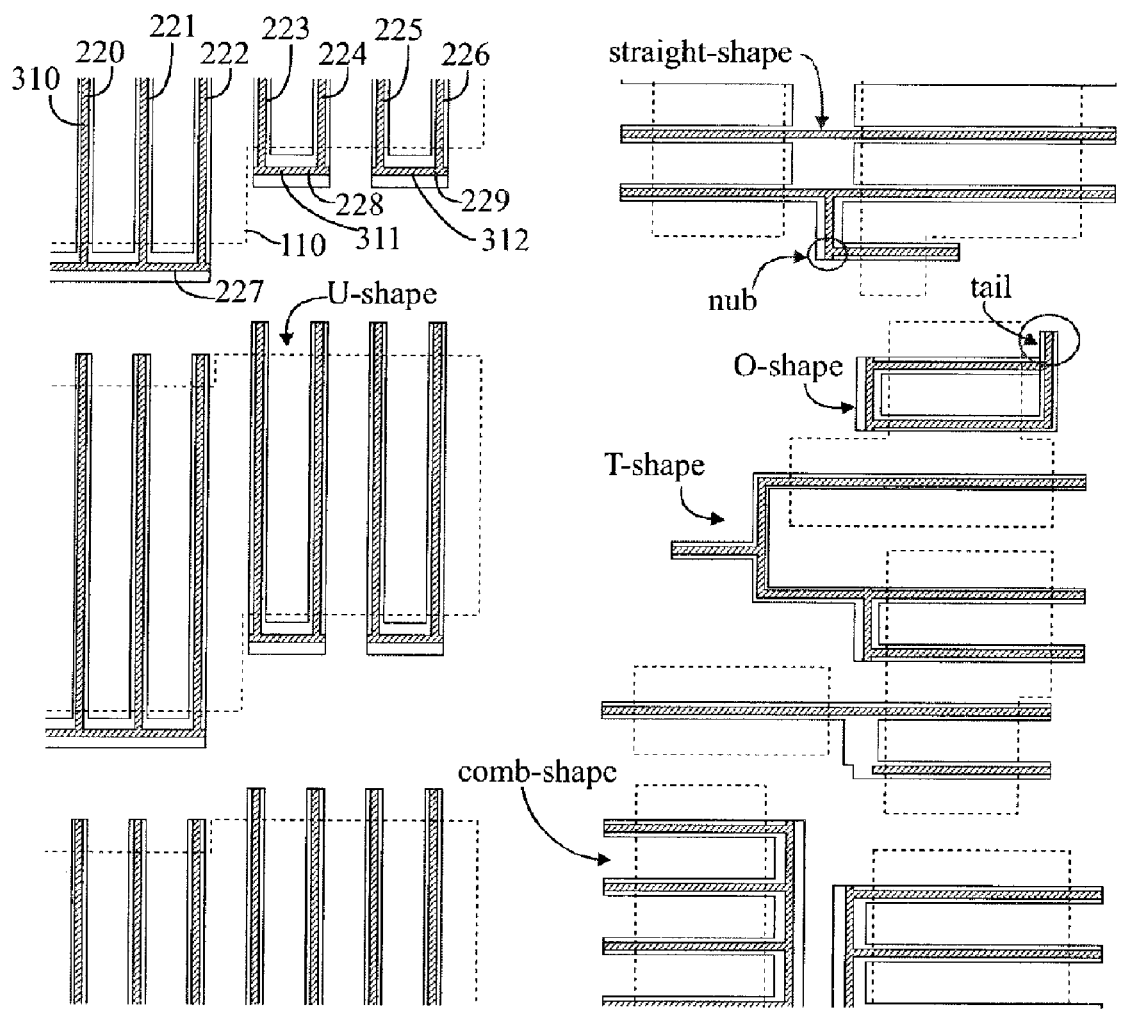
FIG. 3 depicts a merger of the critical and non-critical centerline IC segments of FIG. 2 for creation of a centerline.
Figure 4:
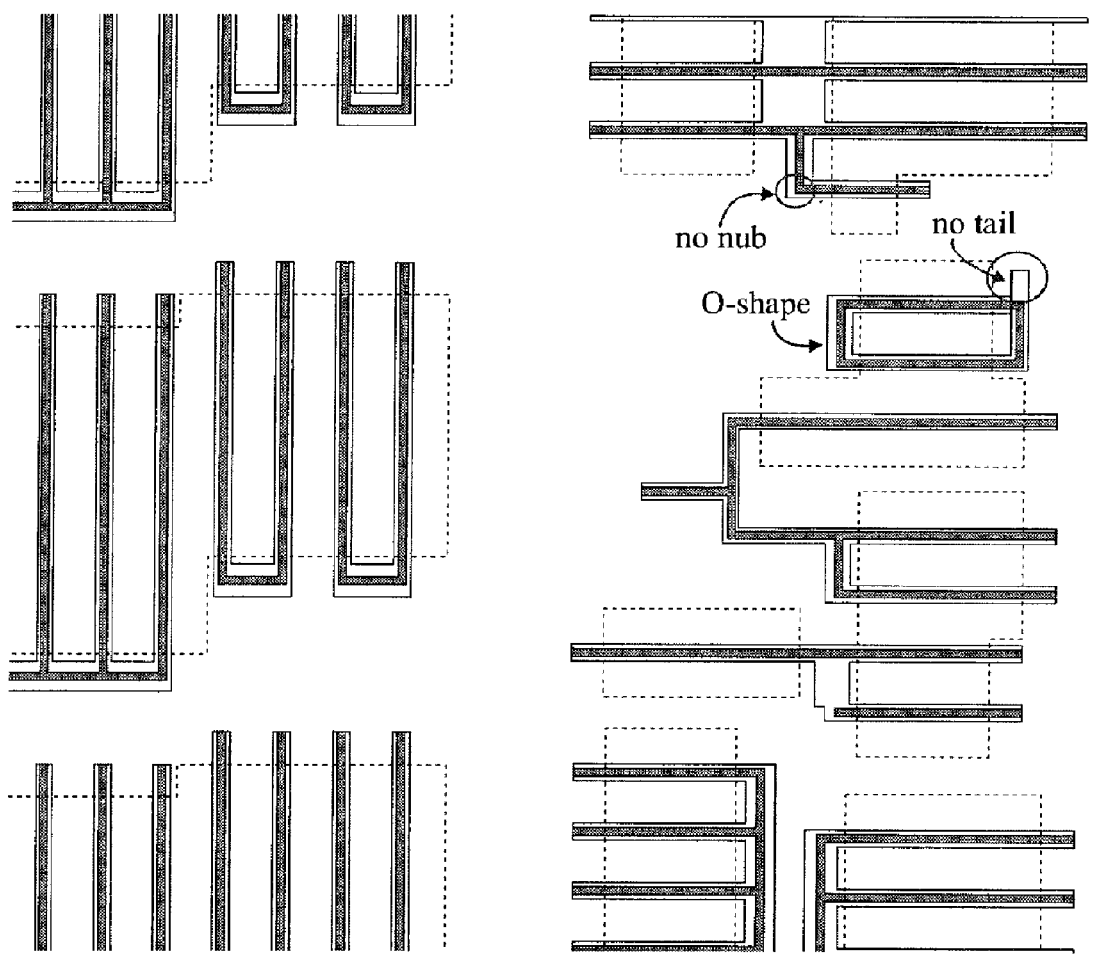
FIG. 4 depicts a cleanup of any appendages found in the merger of FIG. 3.

FIGS. 1-20 are diagrams illustrating a process of forming the masks necessary to perform an optimized edge based image transfer process in accordance with the preferred embodiment. An overall explanation of the process of the invention and drawings is as follows. Beginning with the exemplary layout 100 for an existing IC design FIG. 1, the following steps are performed. A centerline representation is generated as shown in FIGS. 2-4. Portions of the centerline representation are selectively eliminated in FIGS. 5-10. An optimum set of edge shapes are selected in FIGS. 11-14. Manufacturing violations in the edge shapes are removed in FIGS. 15-16. Then BLOCK and LITHO masks are formed in FIGS. 17-18. Finally, the results are checked FIGS. 19, 20.

Figure 1:
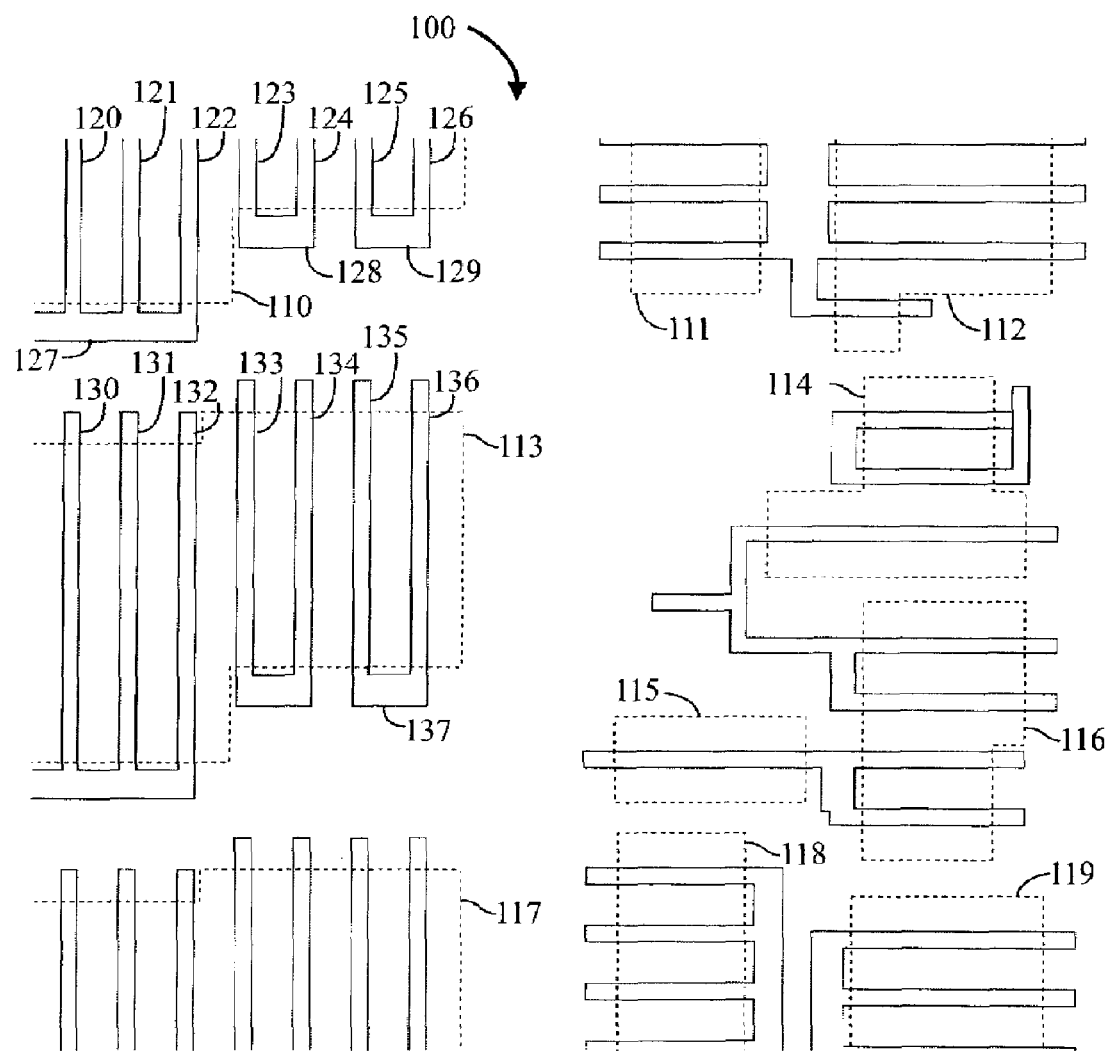
FIG. 1 depicts an integrated circuit ("IC") pattern comprising a plurality of IC shapes.

FIG. 1 depicts an IC pattern 100 comprising a plurality of IC shapes. What is illustrated is a tiny area of an overall chip design, for example an area of a few microns (μm) square. In this figure, the solid lines represent polysilicon conductor ("PC") and the dashed lines represent diffusion areas. Ten diffusion areas 110, 111, 112, 113, 114, 115, 116, 117, 118, 119 are illustrated in FIG. 1. A PC line 120, 121, 122, 123, 124, 125, 126 crossing a diffusion area 110, 111, 112, 113, 114, 115, 116, 117, 118, 119 functions as a gate, such as for a CMOS field effect transistor (FET). Gates must be formed by an edge based image transfer process and therefore will have the same minimal thickness, e.g. 50 nm (500 Å). PC lines outside of diffusion areas function as interconnects. PC line 127 connects the bottom of PC lines 120, 121, 122. Note that interconnects, such as PC line 127, are typically thicker and less sensitive to dimensional variations. Therefore, PC line 127, an interconnect, would be suitably formed by optical lithography instead of edge based image transfer. Some minimal thickness PC lines, shown in FIG. 1, such as 135 and 136 extend beyond the diffusion area 113, which ensures that 135, 136 will cross the diffusion area 113 despite potential misalignments during IC fabrication.

An objective of the preferred embodiment is to generate a set of masks for fabrication of an integrated circuit through the use of an edge based image transfer process such as SIT or alternating phase shift mask, BLOCK and for LITHO, with as much overlap as possible. The process of generating the masks involves first finding all of the PC lines which must formed by SIT, then erasing certain pieces using a BLOCK mask, then adding lines that can't be formed by SIT using LITHO. "Overlap" means that the various pieces will fit together without gaps, due to processing tolerances. For example, by "overlap" it is meant that the LITHO pattern should overlap the SIT pattern where a critical PC line (e.g., the bottom end of line 125) is being connected to a non-critical PC line (e.g., 129). By overlapping, a connection is ensured. Ultimately, it is desired to assemble the various pieces into a continuous, manufacturable pattern. FIG. 1 represents the ultimate goal of the endeavor, generating the various masks required to realize the physical integrated circuit layout represented in FIG. 1 while taking as much advantage of edge based image processes (i.e., with as little LITHO as possible).

FIG. 2 depicts each IC shape in the IC pattern in FIG. 1 divided into critical and non-critical centerline IC segments in accordance with the present invention. PC segments are defined, and classified as either "critical" or "non-critical". Critical centerline segments, which become gates that have a minimum thickness, are shown in solid. Non-critical centerline segments are shown shaded. For example, critical centerline segments 220, 221, 222, 223, 224, 225, 226 correspond to PC lines 120, 121, 122, 123, 124, 125, 126, respectively. Non-critical centerline segments 137, 138, 139 correspond to PC lines 127, 128, 129, respectively. As discussed herein above, critical segments must be fabricated by an edge based image transfer process, while non-critical segments are not restricted to an edge based image transfer process fabrication. However, in order to optimize an edge based pattern transfer process in accordance with a preferred embodiment, it is desirable to form as many non-critical PC segments as possible using an edge based image transfer process. All of the PC segments (e.g., 130 . . . 139) are drawn at a thickness which is the target edge based image transfer thickness, such as 500 Å. Edge based image transfer delivers only one narrow feature size, such as 500 Å. Therefore, non-minimum channel length gates, or in other words, channel length gates that are thicker than, for example 500 Å are specifically excluded from the centerline generation since these features have to be patterned with conventional lithographic means.

FIG. 3 depicts the merger of critical and non-critical centerline IC segments shown in FIG. 2 for creation of a centerline. For example, the critical centerline segments 220, 221, 222 and the non-critical centerline segments 227 are merged into IC shape 310, while critical centerline segments 223, 224 and the non-critical centerline segment 228 are merged into IC shape 311, and critical centerline segments 225, 226 and the non-critical centerline segment 229 are merged into IC shape 312. For each critical centerline segment, the merging piece is always non-critical. In FIG. 3, the merging pieces are 227, 228, and 229. The merger of critical and non-critical segments shown in FIG. 3 represents the IC pattern if entirely formed using an edge based image transfer mask. Not all IC shapes, however, can be form using an edge based image transfer mask, and therefore some IC shapes must be formed with lithography. FIG. 3 depicts various IC shapes, such as U-shapes, 311, 312, T-shapes, E-shapes, comb-shapes, L-shapes, straight shapes, and O-shapes, some of which can be created with edge based image transfer mask and some which cannot. A U-IC shape, can be created with edge based image transfer mask, while a T-IC shape cannot. Other segments of the IC pattern cannot be formed by edge based image transfer mask. As shown in FIG. 3, several of the merged segments have appendages such as little "nubs" extending from the end of lines, or "tails". These appendages cannot be fabricated using an edge based image transfer mask, because they are below the resolution of the edge based image transfer process, and will be fabricated with lithography.

FIG. 4 depicts the clean up of any appendages found in the merger of FIG. 3. All the "nubs" and "tails" shown in FIG. 3 are removed. Data regarding any appendage removed is saved for later processing. For example, the "tail" on the O-shape is removed and saved for later insertion into the design through lithography. Cleanup of appendages cannot be performed on any IC shape that must be formed by edge based image transfer. In other words, no critical feature can be removed. Design rules for the IC should prohibit any mandatory edge based image transfer features from having appendages.

Figure 5:
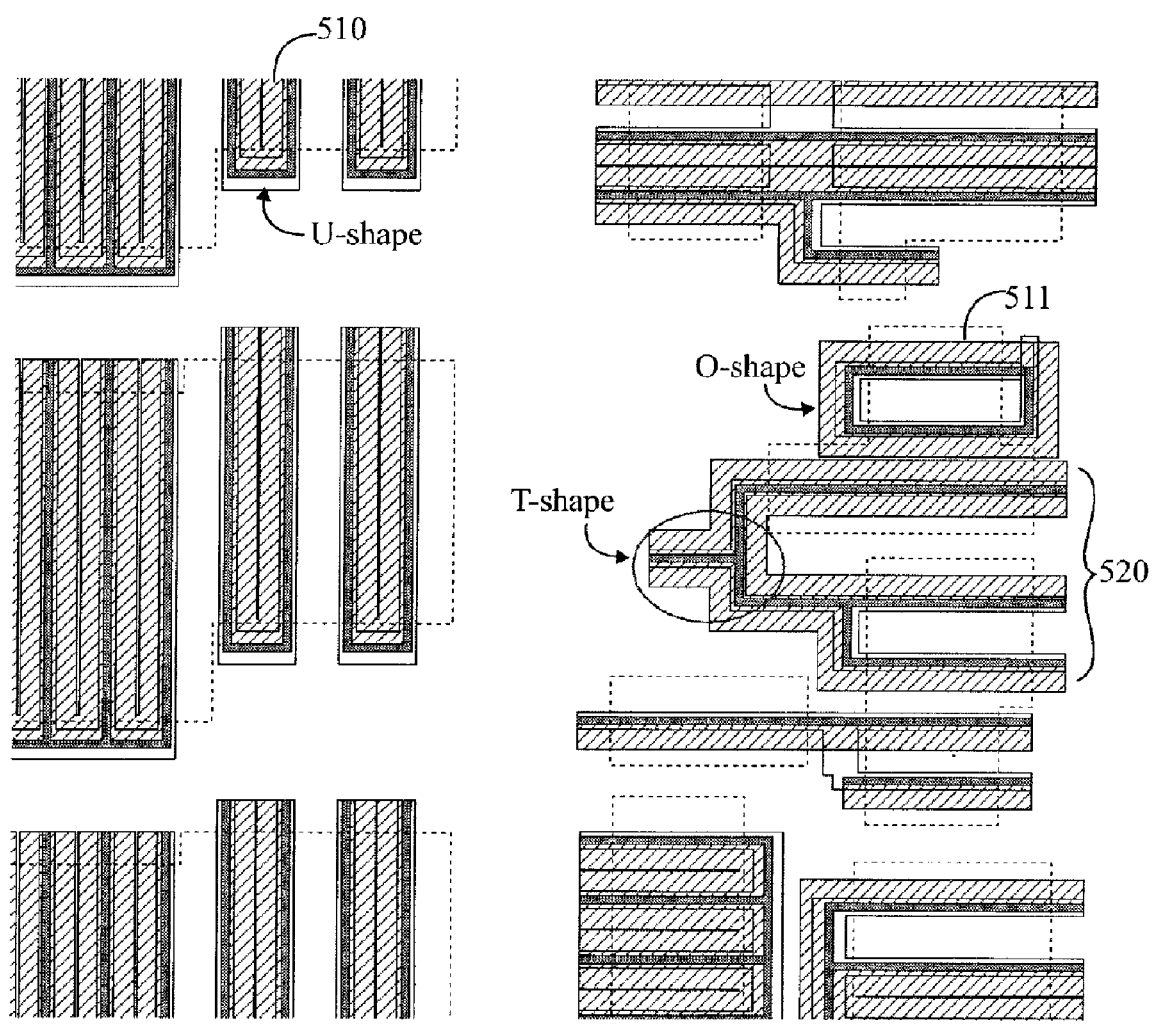
FIG. 5 depicts edge based image transfer mask shape for the entire merged, but cleaned up IC segments of FIG. 4.

FIG. 5 depicts an edge based image transfer mask shape for the entire merged, but cleaned up IC shapes of FIG. 4. In FIG. 5, an edge based image transfer shape is generated one on one side of every centerline shape. Edge based image shapes are represented by hatched lines. While an edge based image transfer shape can be created via SIT or alternating phase shift mask, for purposes of explanation of the preferred embodiment, SIT will be discussed herein as the edge based image transfer process. An SIT shape 510 can be formed on the inside of the U-shaped feature or the inside/outside of the O-shape 511. Choice of whether the SIT shape is formed on the inside/outside of O-shape will be discussed herein below with respect to FIG. 13. IC shape 520, significantly incorporates a T-shape, and as mentioned above, a T-IC shape cannot be fabricated with an edge based image transfer process. Errors such as this will be discussed in further detail with respect to FIG. 6.

Figure 6:
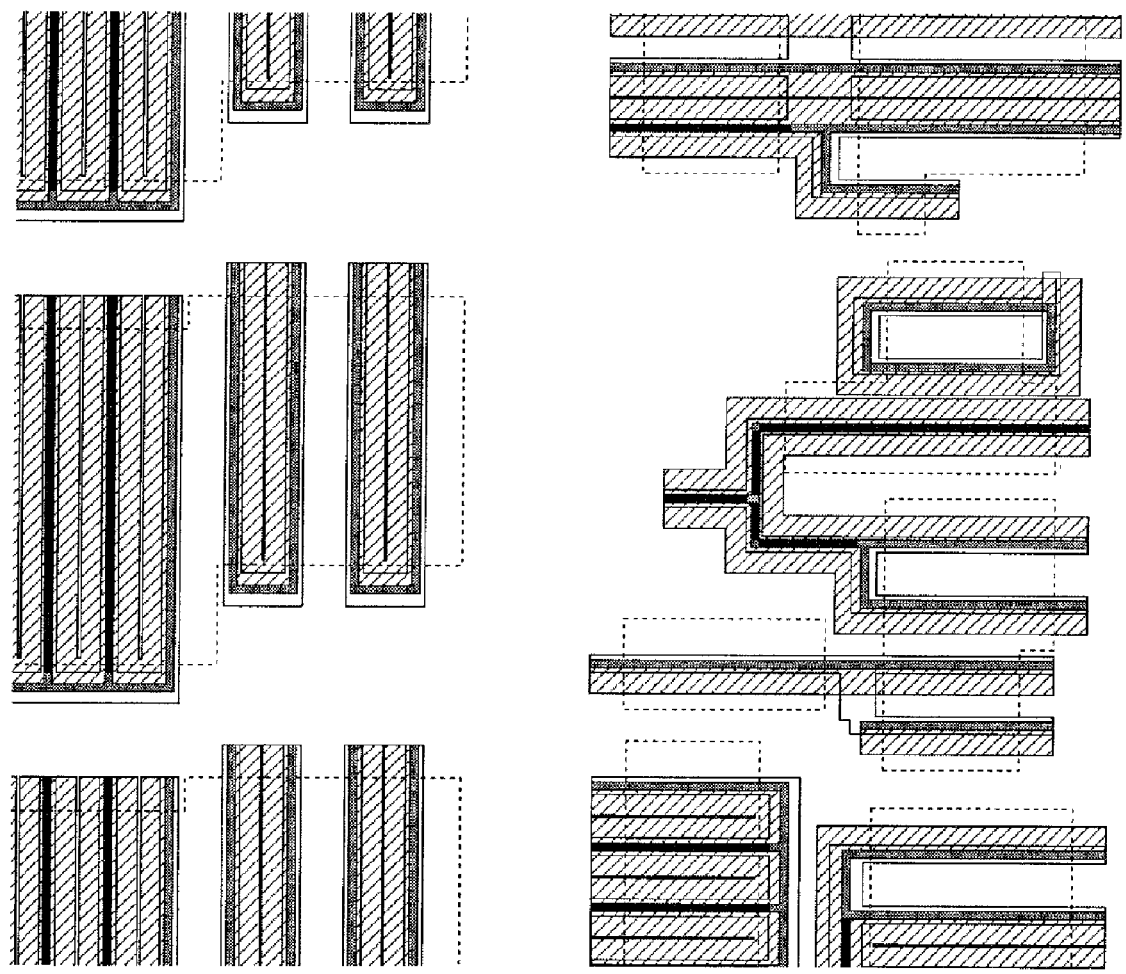
FIG. 6 depicts errors in the use of edge based image transfer mask shape for the entire IC pattern of FIG. 5.

FIG. 6 depicts errors in the use of the edge based image transfer mask shape for the entire IC pattern depicted in FIG. 5. Errors are depicted by solid black lines. As mentioned above, SIT cannot fabricate a T-shape, therefore the T-shape 520 depicted in FIG. 5, has a solid black line. Portions of the centerline representation, such as the T-IC shape, are then selectively eliminated as will be discussed in further detail with respect to FIG. 7. In addition to T-shapes, adjacent IC pair shapes cannot be fabricated because there would be no space between the mesas to deposit the PC. Such is depicted in FIG. 6 with both the two E-shaped patterns with the two solid black lines and the comb pattern with the two solid lines. To eliminate this problem, a binary property is assigned to all adjacent SIT pair shapes and only every other IC shape in the pair is fabricated by SIT. In addition to T-shapes and adjacent IC pair shapes, an error can occur because an SIT shape is not possible for fabrication of the line. Such is depicted in the in FIG. 6 by the solid lines in the IC shapes in the top and bottom right corners. Once errors have been identified, a revised set of centerlines is generated which is depicted in FIG. 7.

Figure 7:
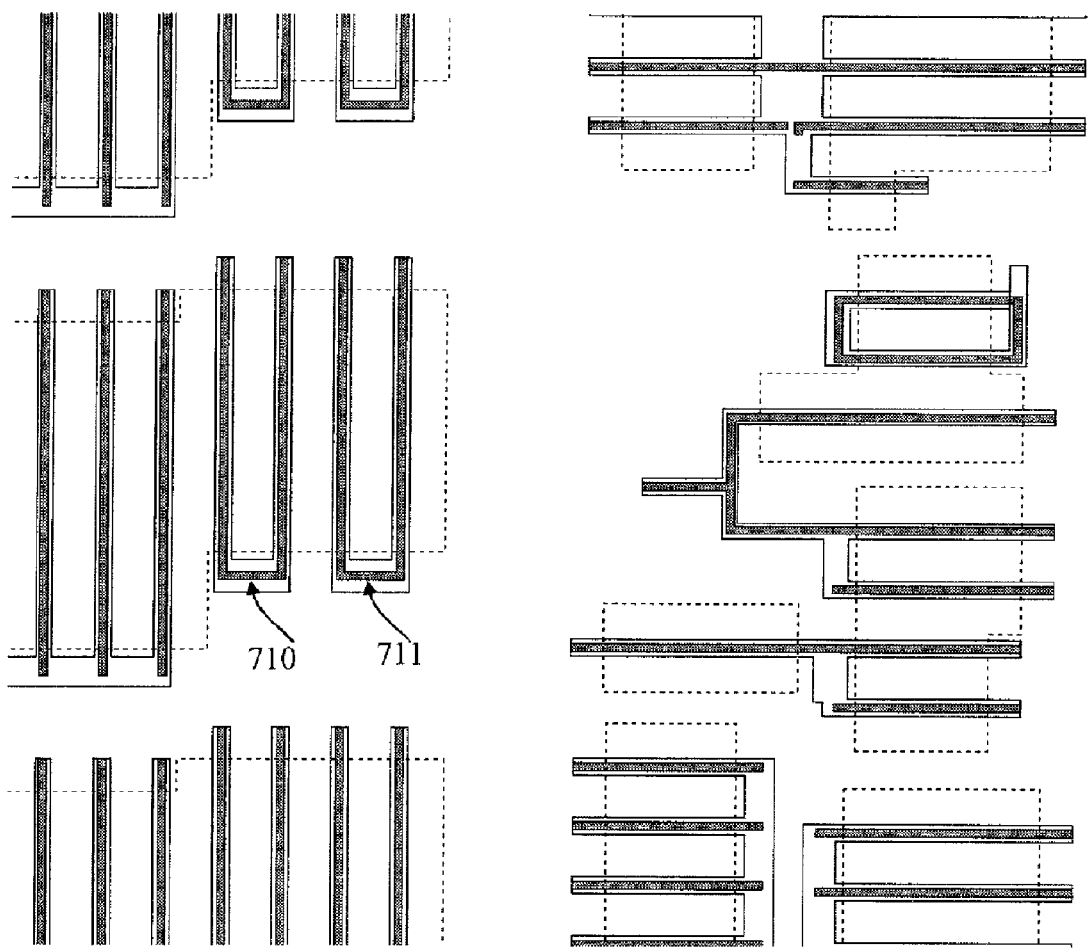
FIG. 7 depicts a select elimination of edge based image transfer mask shape for segments of the IC pattern based upon the errors found in FIG. 6.

FIG. 7 depicts the select elimination of the edge based image transfer mask shape for segments of the IC pattern based upon the errors found in FIG. 6. IC patterns associated with an error in FIG. 5 will be excluded from the set of IC shapes fabricated by SIT. In addition, some IC shapes with a segment that is wider than a minimum, such as an interconnect will be excluded from the set of IC shapes fabricated by SIT, if such IC shape was associated with an error. Not all IC shapes with a segment that is wider than a minimum, however is excluded. Note that interconnects 710 and 711 are segments that are wider than a minimum, but have not been excluded in the select elimination depicted in FIG. 7. Such is because segments 710 and 711 were not identified as IC shapes with an error in FIG. 5.

Figure 8:
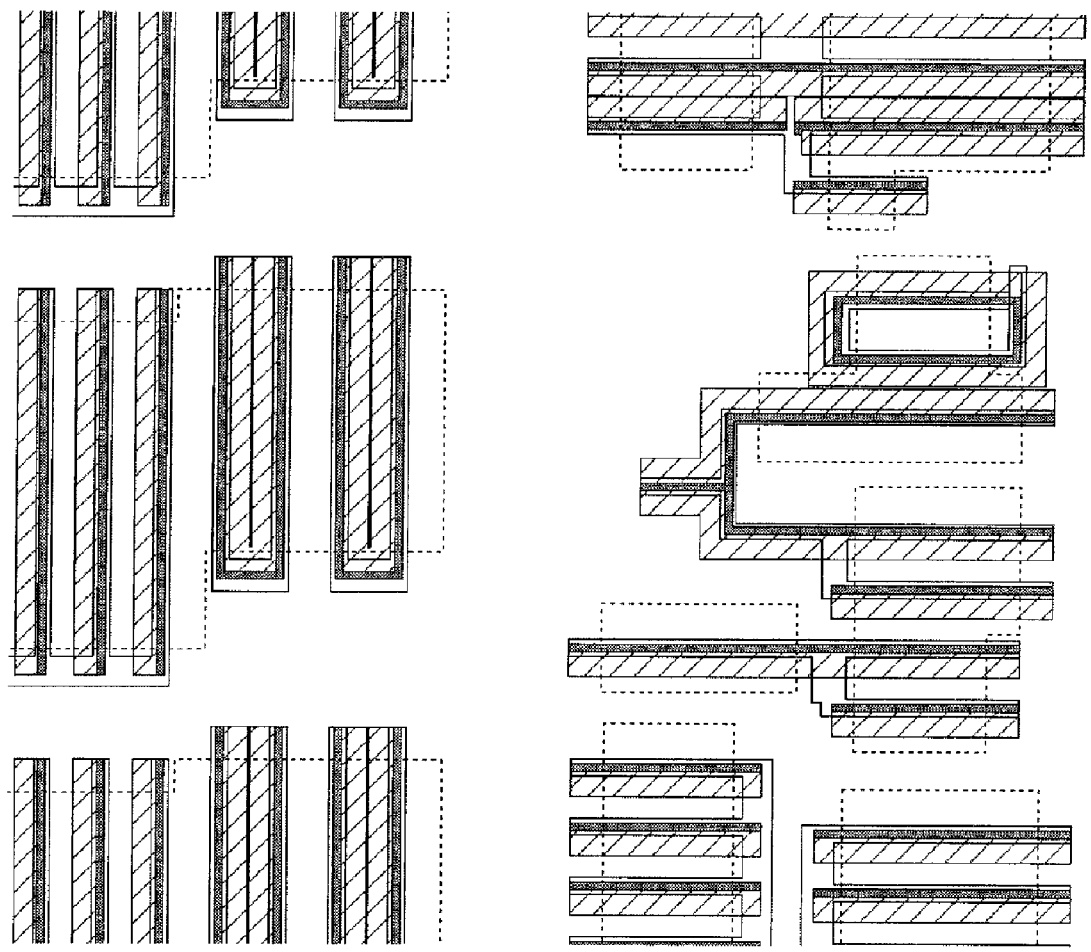
FIG. 8 depicts an improved edge based image transfer mask shape based upon the select elimination of FIG. 7.

FIG. 8 depicts an improved edge based image transfer mask shape based upon the select elimination in FIG. 7. Note that in FIG. 8 because a binary property has been associated with the E and comb IC shapes, SIT is formed only one of two possible centerlines.

Figure 9:
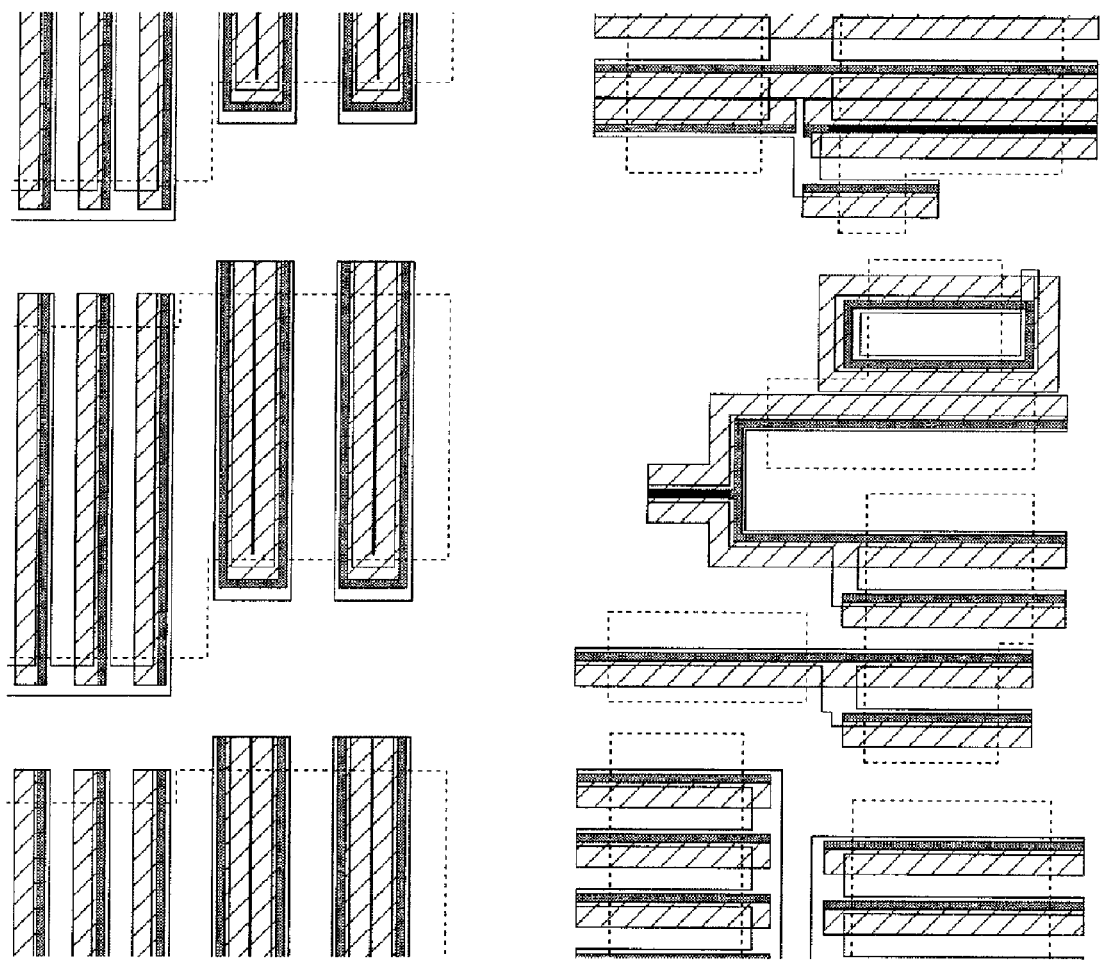
FIG. 9 depicts errors in the improved edge based image transfer mask shape of FIG. 8.

FIG. 9 depicts errors in the improved edge based image transfer mask shape of FIG. 8. In FIG. 9, errors as in FIG. 6 are depicted with solid black. In the top right IC shape, once again there is a centerline with adjacent SIT shapes. Because a mesa would have to be on both sides of this pattern, an error is depicted. In addition, FIG. 9 also depicts a T-shape, which as described herein above, cannot be fabricated by SIT.

Figure 10:
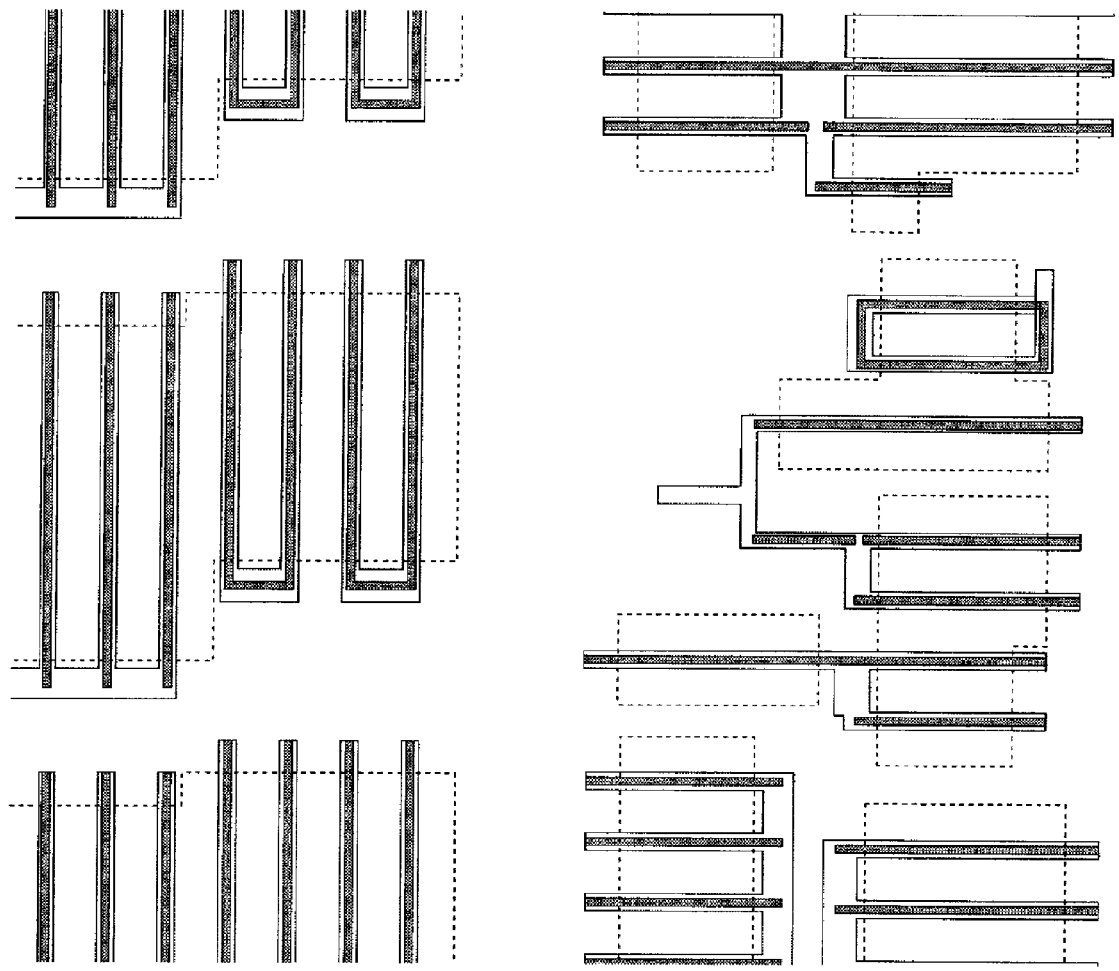
FIG. 10 depicts a further select elimination of edge based image transfer mask shape for segments of the IC pattern of FIG. 9.

FIG. 10 depicts a further select elimination of edge based image transfer mask shape for segments of the IC pattern of FIG. 9. With the IC shapes associated with an error in FIG. 9, in FIG. 10 any narrow segment in a non-gate forming region is eliminated. By comparison, with the IC shapes associated with an error in FIG. 6, in FIG. 7 any wider than a minimum segment was eliminated. As a result of the select elimination in FIG. 10, the centerline segment that was solid black in FIG. 9, is depicted without SIT. FIG. 10, therefore depicts that the entire "T-shape" is eliminated. Based upon these twice revised centerlines, it is next determined where SIT shapes could be formed to generate the PC lines.

Figure 11:
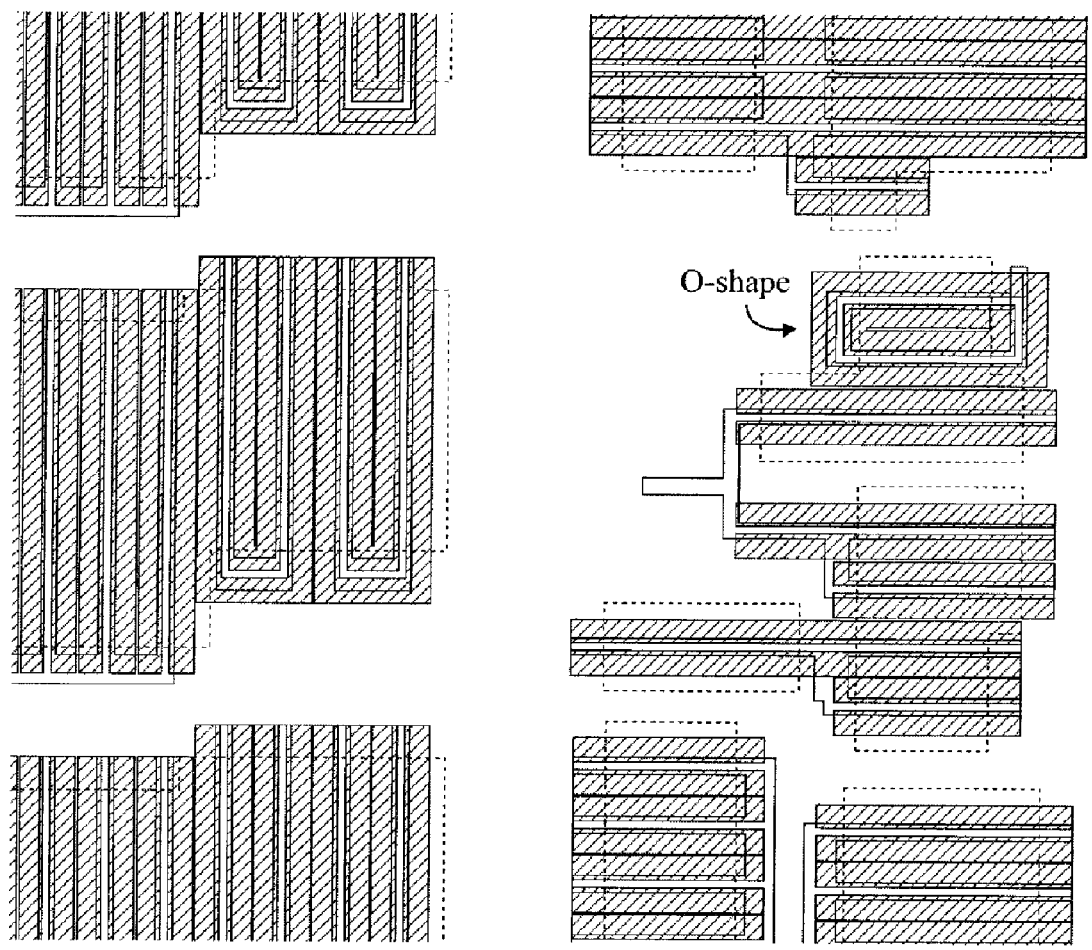
FIG. 11 depicts the first step in creating the edge based image transfer mask shape based upon the select elimination of FIG. 10.

FIG. 11 depicts the first step in creating the edge based image transfer mask shape based upon the further select elimination of FIG. 10. In FIG. 11, SIT shapes are formed on both sides of the centerlines in the twice revised set centerline from FIG. 10. Ultimately, only one of the two SIT shapes will be used to generate the SIT mask. For example with respect to the O-shape, there is a SIT shape on the inside of the O-shape, and on the outside of the O-shape. Ultimately, only one of the two SIT shapes will be used to generate the SIT mask. Similarly, with respect to the U-shapes in the top left corner of FIG. 11, a SIT shape is on the inside and outside of both U-shapes.

Figure 12:
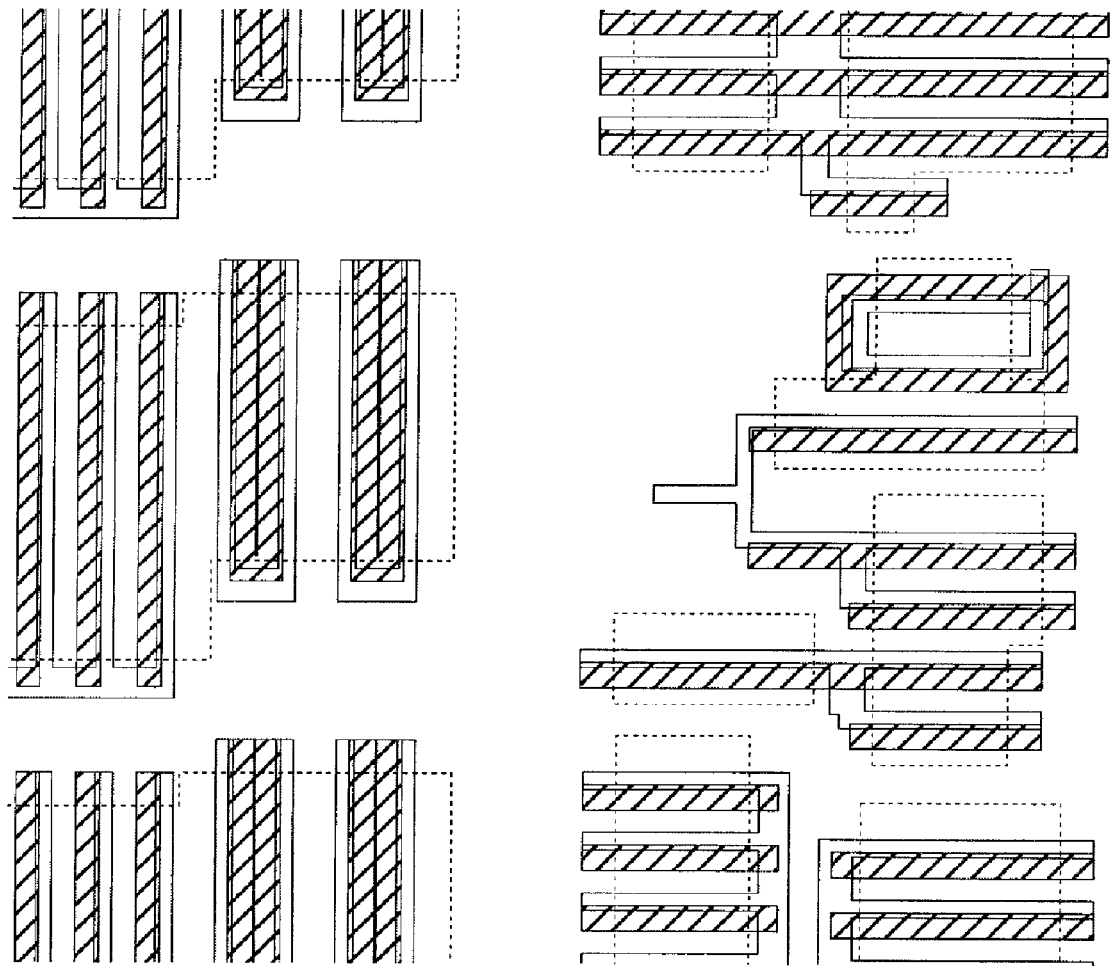
FIG. 12 depicts removal of one half of the edge based image transfer mask precursors of FIG. 11.

FIG. 12 depicts removal of the one half of the edge based image transfer mask shape precursors of FIG. 11. Only one half of the SIT shapes are kept. With respect to the O-shape, the outside SIT shape has been kept. With respect to the U-shapes in the top left corner of FIG. 12, the inside SIT shapes have been kept.

Figure 13:
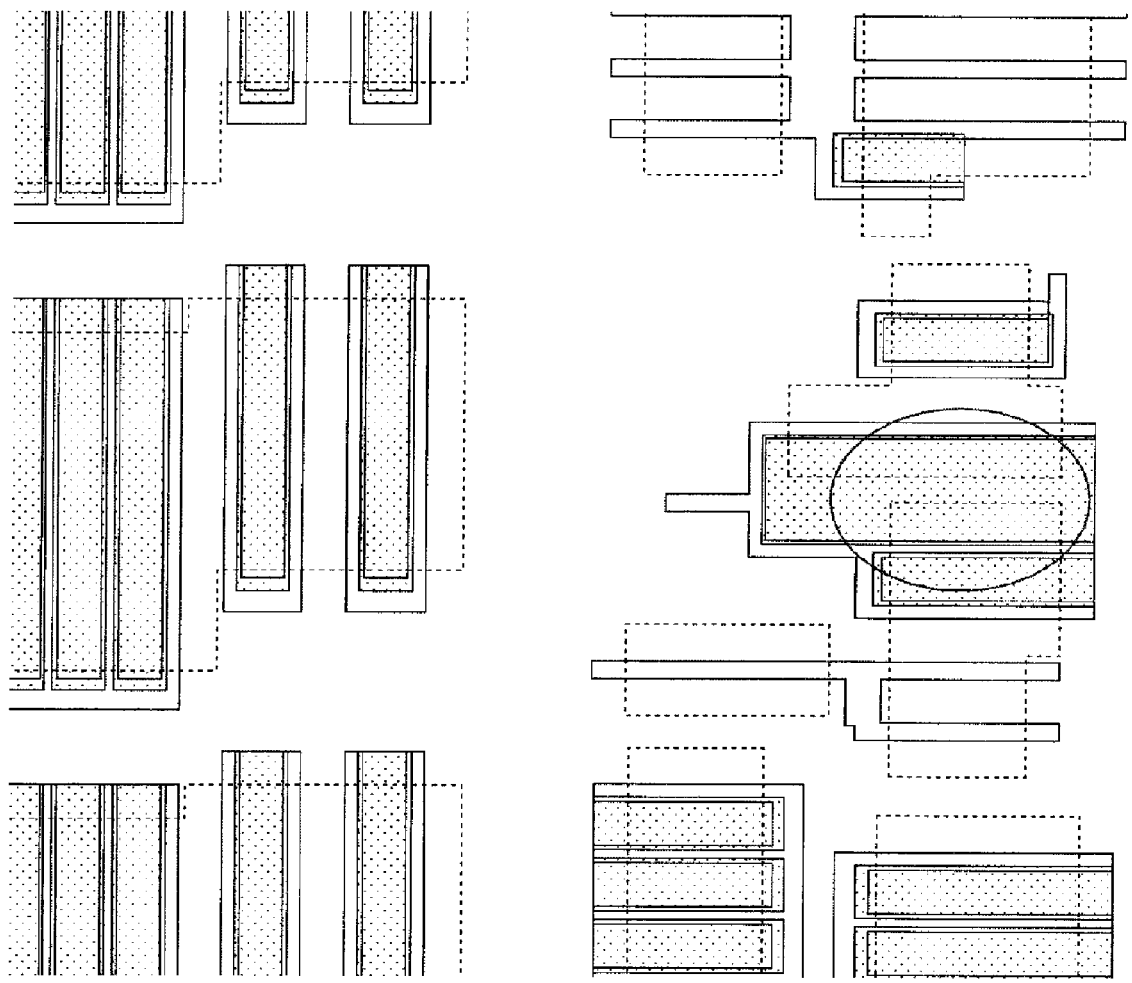
FIG. 13 depicts a select choice of edge based image transfer mask shape for certain segment shapes of FIG. 12.

FIG. 13 depicts a select choice of edge based image transfer mask shape for certain segment shapes in FIG. 12. Such choice is based upon complexity. For example, complexity can be measured by counting the corners of the SIT shapes. For example, the more corners in the SIT shape the more complex the SIT shape. Alternatively, complexity can be measured by comparing the perimeter of the SIT shape to the area of the SIT shape, where a lower ratio is less complex. Such is depicted in FIG. 13 with regard to the O-shape. It would be less complex to create a mesa within the O-shape, then along the perimeters of the O-shape.

Figure 14:
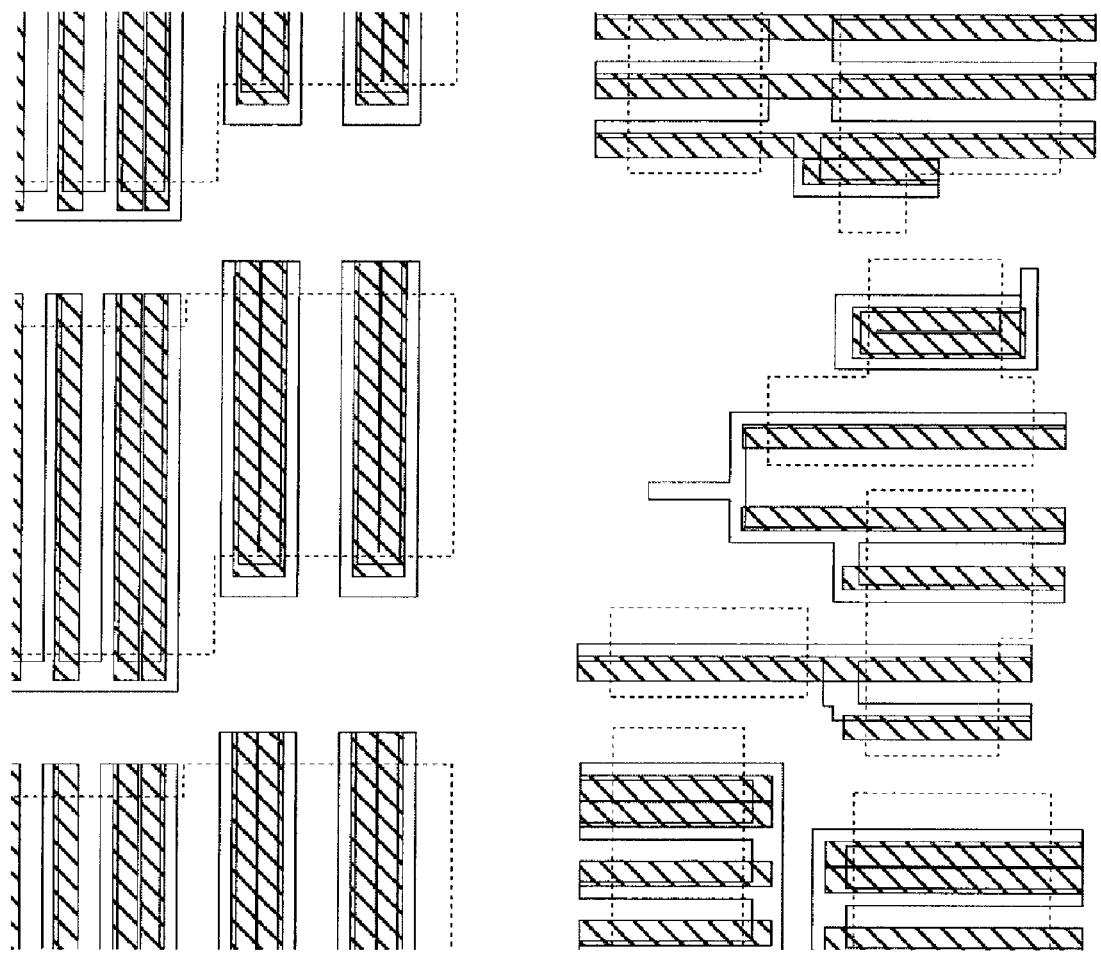
FIG. 14 depicts edge based image transfer mask shape in accordance with the select choice of FIG. 13.

FIG. 14 depicts edge based image transfer mask shape in accordance with the selections made in FIG. 13. Some of the SIT shapes have been flipped. For example, the SIT shape for the O-shape has been flipped from the outside of the O-shape as depicted in FIG. 12 to the inside of the O-shape as depicted in FIG. 14. Similarly, the middle prong of the E shaped structures in the top left corner has been flipped from the left side of the middle prong in FIG. 12 to the right side of the middle prong in FIG. 14. Such has been done to minimize the complexity noted in FIG. 13.

Figure 15:
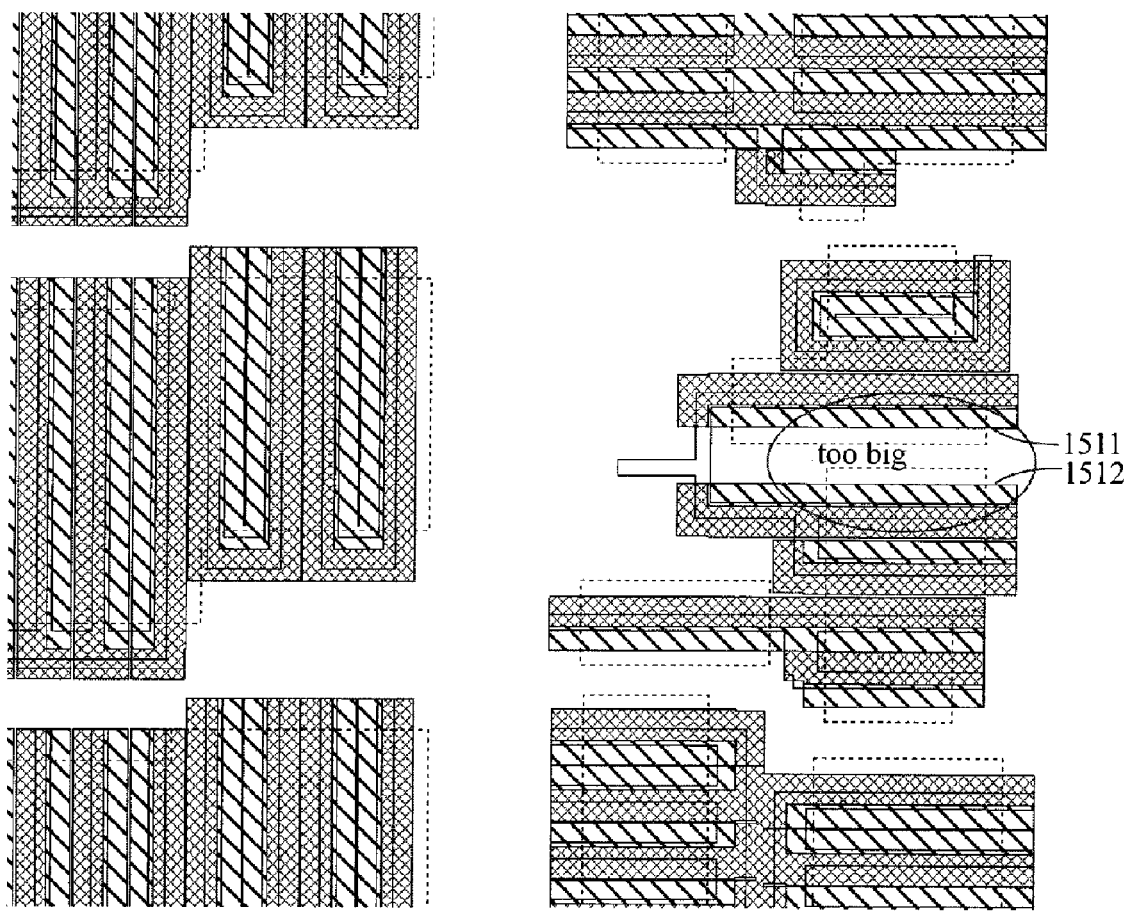
FIG. 15 depicts edge based image transfer exclusion areas for the edge based image transfer mask shape of FIG. 14.

FIG. 15 depicts edge based image transfer exclusion areas for the edge based image transfer mask shape of FIG. 14. More particularly, in FIG. 15 exclusion regions across which SIT shapes cannot be expanded or merged without causing image degradation. These regions are shown in this figure with double hatching (X). In so doing, at least a minimum spacing is maintained between the SIT shapes (mesas). Also, the space between two SIT shapes (e.g., 1511, 1512) may be too big, as highlighted by the circled area in the figure[1].

Figure 16:
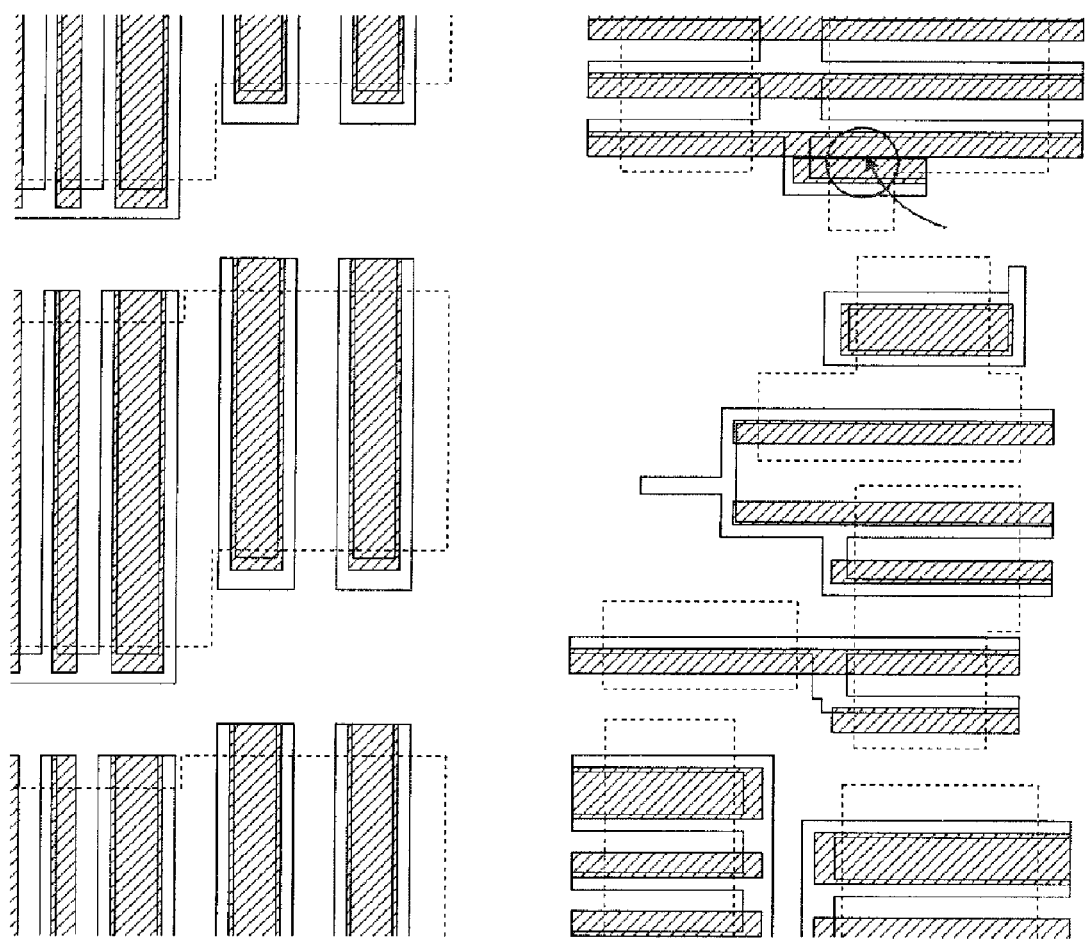
FIG. 16 depicts the final edge based image transfer shape mask.

FIG. 16 depicts the final edge based image transfer mask shape. The final edge based image transfer mask shape is based upon the exclusion regions defined by FIG. 15. The mesas for the SIT are depicted in FIG. 16.

Figure 17:
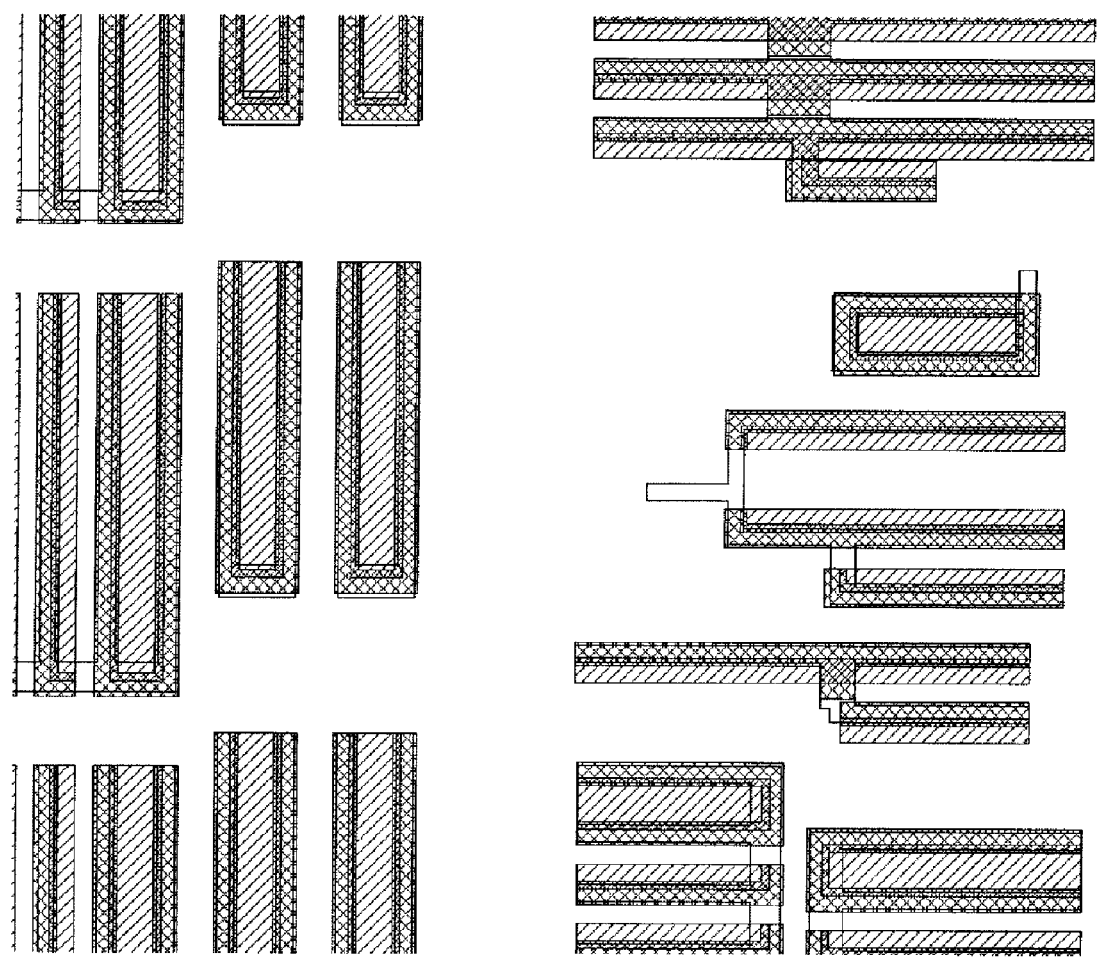
FIG. 17 depicts the Block mask.

FIG. 17 depicts the block mask. The block mask removes any residual portions of the SIT, while protect the intended SIT images. For example, in FIG. 17, the block mask removes portions of the SIT in the IC shape shown in the top right hand corner of FIG. 17. Such is shown by the thick lateral cross hatch in this IC shape. Similarly, the block mask protects the intended SIT image, which is shown by the cross hatch that surrounds the perimeter of the O shape in FIG. 17.

Figure 18:
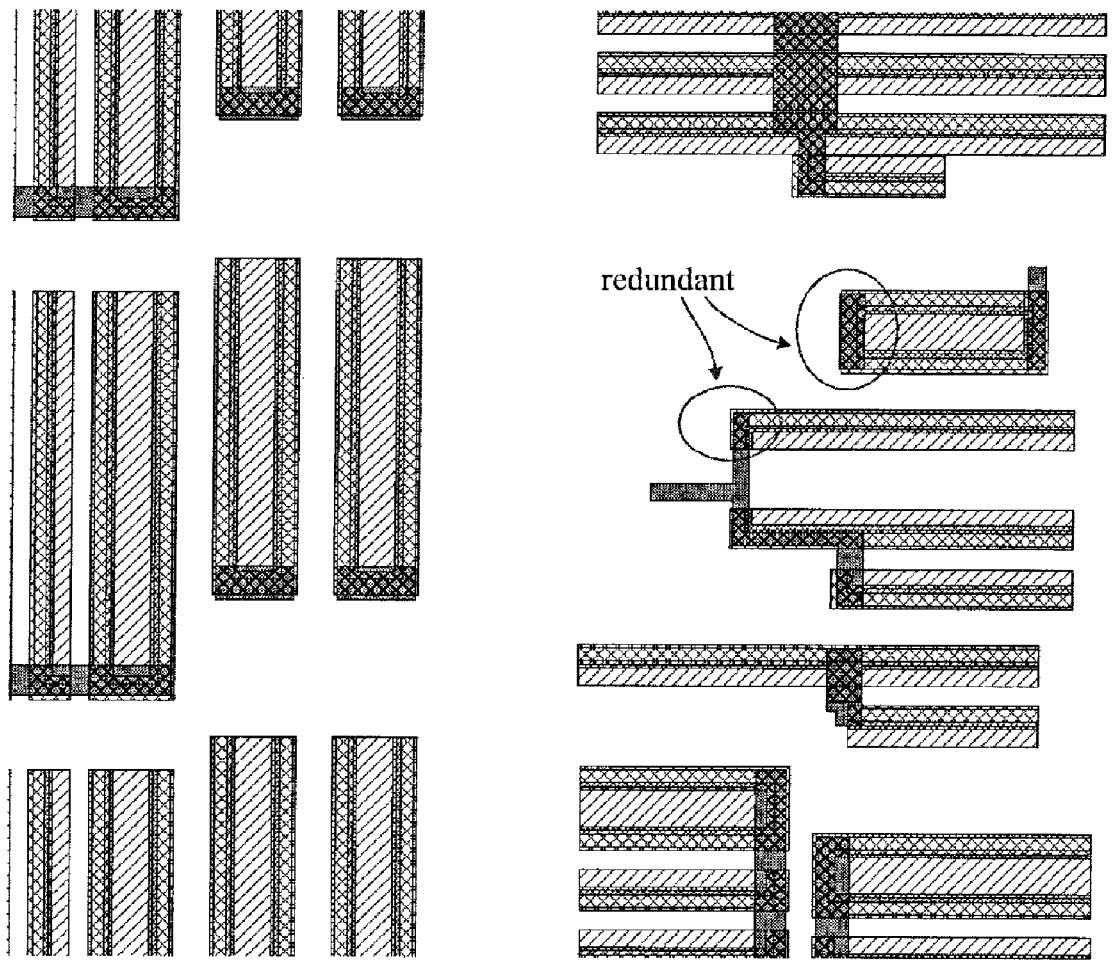
FIG. 18 depicts the lithography mask.

FIG. 18 depicts the lithography mask. In definition of the lithography mask, first the IC shapes which must be generated by SIT are excluded from the lithography mask. As described above, gates must be generated by SIT. Once this has been done, IC shapes that must be formed by conventional lithography are defined. As described above, any T-shaped structures must be formed by lithography. Some areas of the IC pattern will be redundant or in other words formed by both SIT and lithography. As described above such redundancy, or overlap ensures that a connection is made between a critical and non-critical line. FIG. 18 circles some of the redundancy areas.

Figure 19:
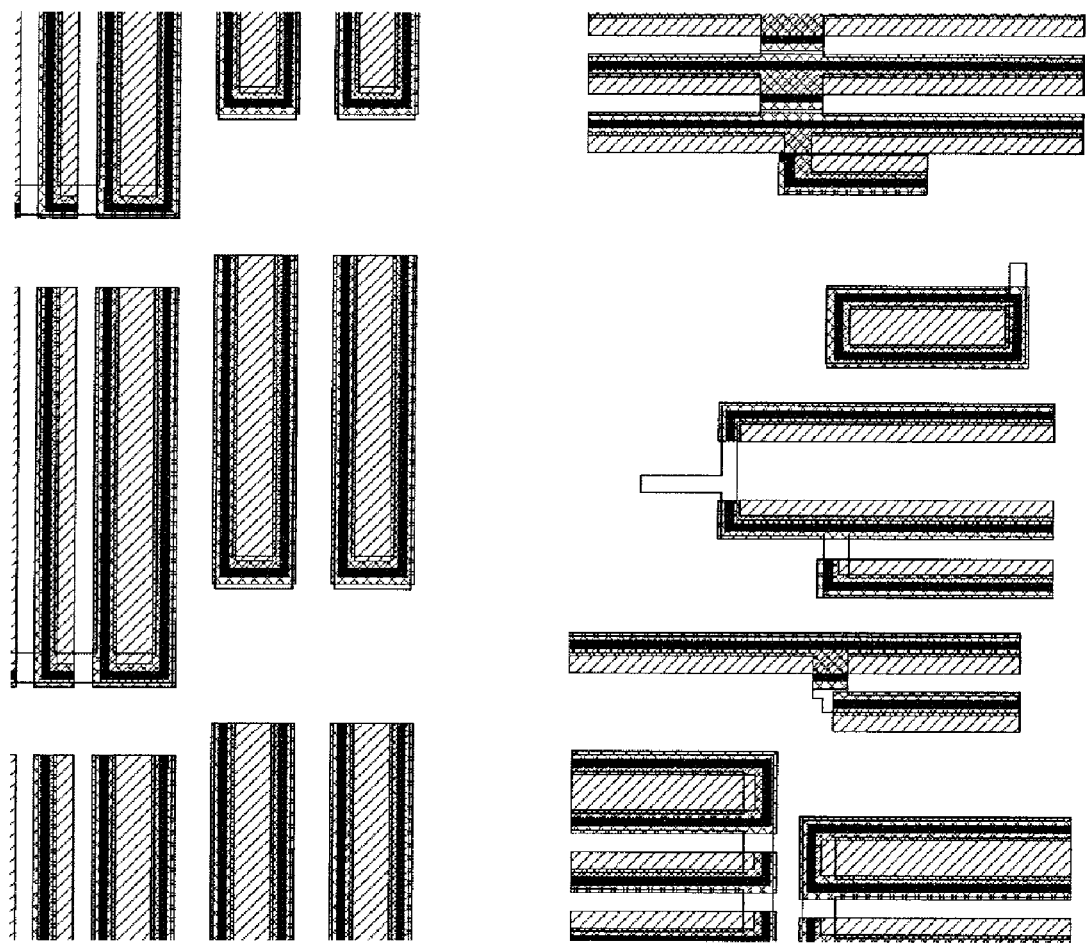
FIG. 19 depicts the predicted edge based image transfer wafer pattern based upon the masks of FIGS. 16, 17, and 18; and, FIG. 20 depicts the integrated circuit pattern based upon overlap between the edge based image transfer and lithography overlap.

FIG. 19 depicts the predicted edge based image transfer wafer pattern based upon the masks of FIGS. 16-18. In so doing, any additional errors can be identified in the IC pattern.

Figure 20:
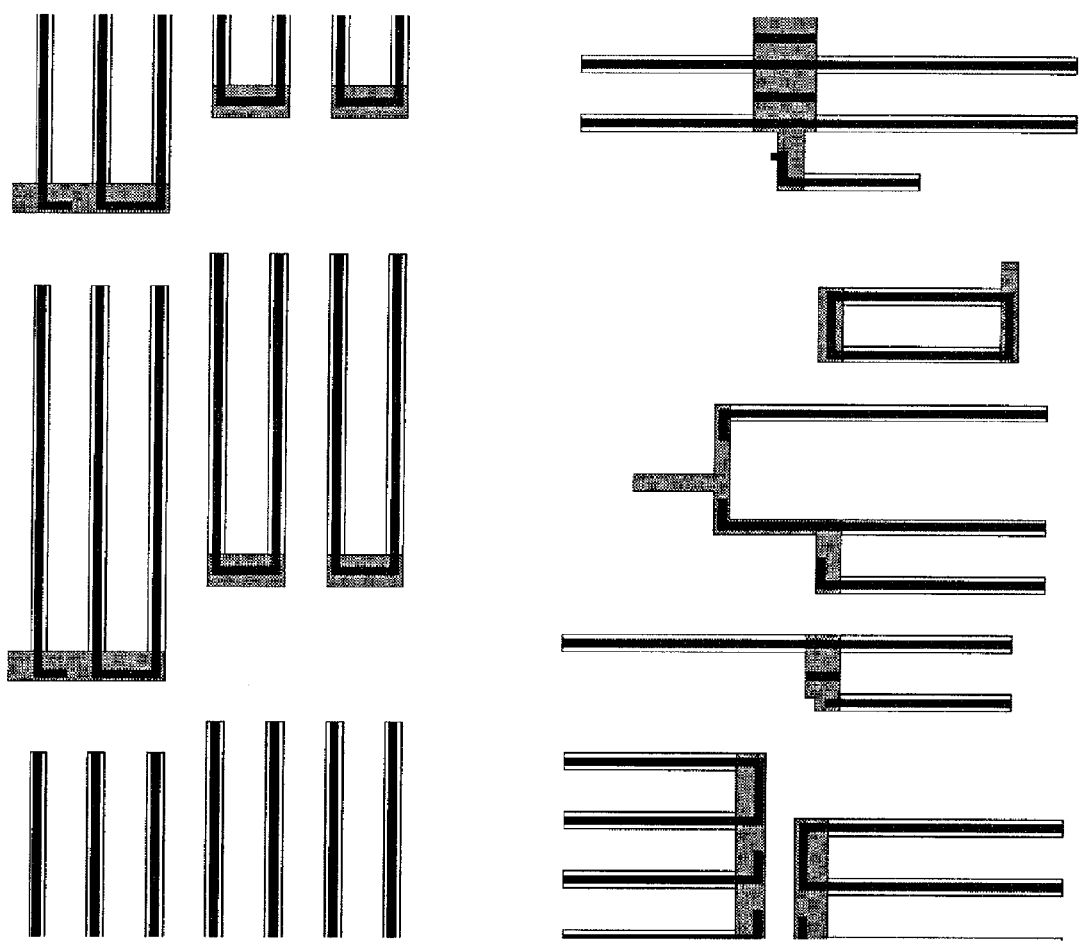

FIG. 20 depicts the integrated circuit pattern based upon overlap between the edge based image transfer and the lithography. The SIT images are shown in solid black, while the lithography overlap is shown in gray.

The layout conversion process of the preferred embodiment can be implemented as software running on an electronic computer aided design system. Such systems are well known in the art, and therefore will be described only generally.

Present computer aided design (CAD) systems for the design of electronic circuits, referred to as ECAD or Electronic CAD systems, assist in the design of electronic circuits by providing a user with a set of software tools running on a digital computer with a graphical display device. Typically, five major software program functions run on the ECAD system: a schematic editor, a logic compiler, a logic simulator, a logic verifier, and a layout program. The schematic editor program allows the user of the system to enter and/or modify a schematic diagram using the display screen, generating a net list (summary of connections between components) in the process. The logic compiler takes the net list as an input, and using a component database puts all of the information necessary for layout, verification and simulation into a schematic object file or files whose format(s) is(are) optimized specifically for those functions. The logic verifier checks the schematic for design errors, such as multiple outputs connected together, overloaded signal paths, etc., and generates error indications if any such design problems exist. The logic simulator takes the schematic object file(s) and simulation models, and generates a set of simulation results, acting on instructions initial conditions and input signal values provided to it either in the form of a file or user input. The layout program generates data from which a semiconductor chip (or a circuit board) may be laid out and produced.

Figure 21:
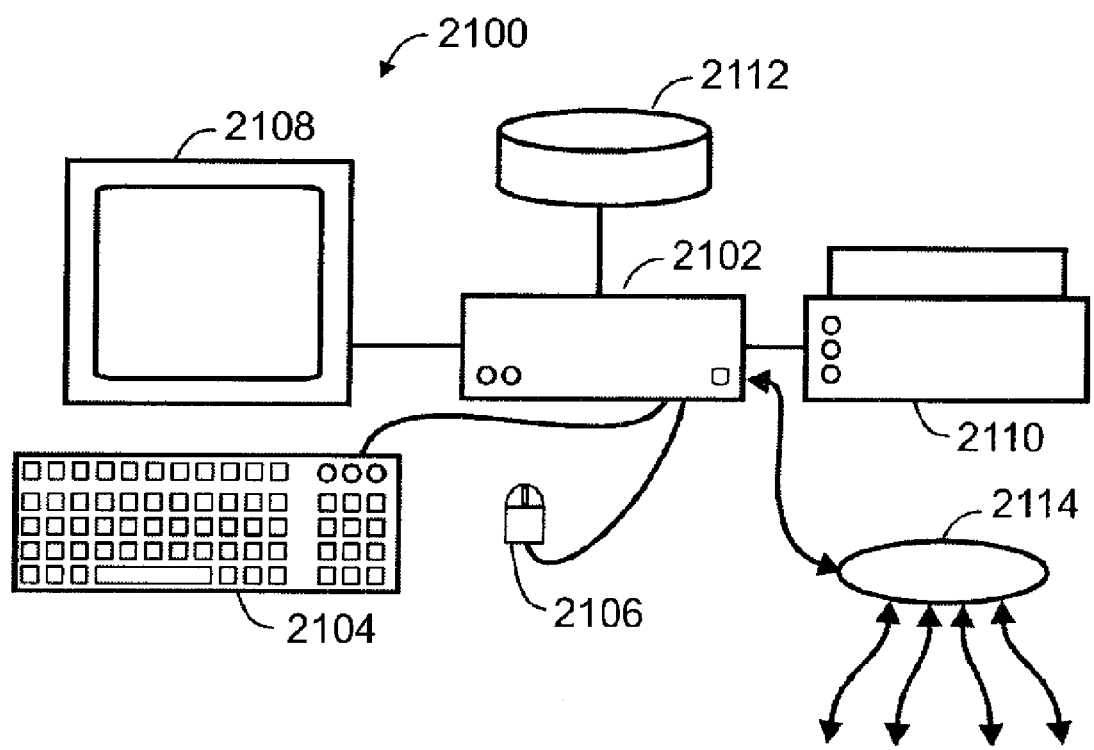
FIG. 21 is a block diagram of an electronic design system upon which the invention can be implemented, according to the invention.

FIG. 21 illustrates a generalized and greatly simplified ECAD system 2100 suitable for running the layout conversion program of the present invention. A computer (CPU) 2102 is at the heart of the system, and contains all the conventional hardware for interfacing with input devices such as a keyboard 2104 and a pointing device (mouse) 2106, as well as with output devices such as a monitor 2108 and a printer 2110. A mass storage device 2112 is interfaced to the computer 2102 and contains for example (i) the layout conversion software of the present invention and (ii) an existing circuit layout for which the present layout conversion software will produce the patterns for the three masks necessary to perform the SIT process, as described hereinabove. The computer 2102 can of course communicate with any number of other computers, workstations and the like via a suitable network 2114 such as a local area network (LAN) a wide area network (WAN) or the Internet.

In use, a user or users would load the layout conversion software of the present invention, and load an existing circuit layout for which the layout conversion software will produce the patterns for the three masks necessary to perform the SIT process, as described hereinabove, interacting as may be necessary with the program to achieve the desired result. Then, output files for the masks are generated and passed on to other users for implementing the SIT process.

The present invention can be realized in a centralized fashion in one computer system, or in a distributed fashion where different elements are spread across several interconnected computer systems. Any kind of computer system or other apparatus adapted for carrying out the methods described herein is suitable. A typical combination of hardware and software could be a general purpose computer system with a computer program that, when being loaded and executed, controls the computer system such that it carries out the methods described herein. The present invention can also be embedded in a computer program product, which comprises all the features enabling the implementation of the methods described herein, and which, when loaded in a computer system, is able to carry out these methods.

Computer program means or computer program in the present context mean any expression, in any language, code or notation, of a set of instructions intended to cause a system having an information processing capability to perform a particular function either directly or after conversion to another language, code or notation and/or reproduction in a different material form.

In sum, the present invention enables creation of a final mask set that optimizes use of an edge based image transfer process for creation of an integrated circuit. In so doing, the present invention takes advantage of the frequency doubling and tight dimensional control benefits associated with edge based image transfer. At the same time, the present invention utilizes lithography for creation of integrated circuit shapes that cannot be created by edge based image transfer as well as for assurance of a connection between integrated circuit shapes that must be created by edge based image transfer and integrated circuit shapes that are created by lithography.

While the invention has been particularly described in conjunction with a specific preferred embodiment and other alternative embodiments, it is evident that numerous alternatives, modifications and variations will be apparent to those skilled in the art in light of the foregoing description. It is therefore intended that the appended claims embrace all such alternatives, modifications and variations as falling within the true scope and spirit of the invention.

What is claimed is:

1. A method for converting an integrated circuit (IC) design into a plurality masks that optimize an edge based pattern transfer process for fabrication of said IC, comprising:

generating an edge based image transfer mask for fabrication of an optimized number of edge based image transfer shapes in an IC pattern comprising a plurality of IC shapes;

generating a block mask that removes residual sections of said optimized number of edge based image transfer shapes; and, generating a lithography mask for fabrication of any remaining IC shapes in said IC pattern.

2. A method as in claim 1, said optimized number of edge based image transfer shapes includes any polysilicon line over a diffusion area in said IC pattern.

3. A method as in claim 1, said optimized number of edge based image transfer shapes includes a set of shapes that minimizes cost of fabrication of said IC.

4. A method as in claim 1, said optimized number of edge based image transfer shapes includes a set of shapes that optimizes IC performance.

5. A method as in claim 1, said generating an edge based image transfer mask step further comprises:

selecting a set of edge based image transfer shapes in said plurality for said optimized number of edge based image transfer shapes in said IC pattern.

6. A method as in claim 5, further comprising:

iteratively reducing said set based upon errors in the said generation of said edge based image transfer shapes.

7. A method as in claim 6, further comprising:

within said reduced set of edge based image transfer shapes, selectively choosing a most favorable edge based image transfer shape for each edge based image transfer shape, thereby creating a final set of edge based image transfer shapes.

8. A method as in claim 7, said selectively choosing step, further comprising:

defining exclusion areas around said final set of edge based image transfer shapes substantially preventing expansion of edge based image transfer shapes that would cause at least partial IC failure in response to edge based image expansion.

9. A method as in claim 1, said edge based image transfer comprises one of sidewall image transfer, and alternating phase shift mask.

10. A method for converting an integrated circuit (IC) design into a plurality of masks that optimize an edge based pattern transfer process for fabrication of said IC, comprising:

generating an edge based image transfer mask for fabrication of an optimized number of edge based image transfer shapes in an IC pattern comprising a plurality of shapes;

selecting a set of edge based image transfer shapes in said plurality for said optimized number of edge based image transfer shapes in said IC pattern; and, iteratively reducing said set based upon errors in the said generation of said edge based image transfer shapes.

11. A method as in claim 10, said optimized number of edge based image transfer shapes includes any polysilicon line over a diffusion area in said IC pattern.

12. A method as in claim 10, said optimized number of edge based image transfer shapes includes a set of shapes that minimizes cost of fabrication of said IC.

13. A method as in claim 10, said optimized number of edge based image transfer shapes includes a set of shapes that optimizes IC performance.

14. A method as in claim 10, said edge based image transfer comprises one of sidewall image transfer, and alternating phase shift mask.

15. A method for converting an integrated circuit (IC) design into a plurality of masks that optimize an edge based pattern transfer process for fabrication of said IC, comprising:

generating an edge based image transfer mask for fabrication of an optimized number of edge based image transfer shapes in an IC pattern comprising a plurality of shapes;

selecting a set of edge based image transfer shapes in said plurality for said optimized number of edge based image transfer shapes in said IC pattern, each edge based image transfer shape in said set comprising a binary edge based image transfer manufacture option; and, selectively choosing a most favorable edge based image transfer binary manufacture option for each edge based image transfer shape, thereby creating a final set of edge based image transfer shapes.

16. A method as in claim 15, said optimized number of edge based image transfer shapes includes any polysilicon line over a diffusion area in said IC pattern.

17. A method as in claim 15, said optimized number of edge based image transfer shapes includes a set of shapes that minimizes cost of fabrication of said IC.

18. A method as in claim 15, said optimized number of edge based image transfer shapes includes a set of shapes that optimizes IC performance.

19. A method as in claim 15, said edge based image transfer comprises one of sidewall image transfer, and alternating phase shift mask.

20. A method for converting an integrated circuit (IC) design into a plurality of masks that optimize an edge based pattern transfer process for fabrication of said IC, comprising:

generating an edge based image transfer mask for fabrication of an optimized number of edge based image transfer shapes in an IC pattern comprising a plurality of IC shapes;

selecting a set of edge based image transfer shapes in said plurality for said optimized number of edge based image transfer shapes in said IC pattern; and, defining exclusion areas around said set of edge based image transfer shapes substantially preventing expansion of edge based image transfer shapes that would cause at least partial IC failure in response to edge based image expansion.

21. A method as in claim 20, said optimized number of edge based image transfer shapes includes any polysilicon line over a diffusion area in said IC pattern.

22. A method as in claim 20, said optimized number of edge based image transfer shapes includes a set of shapes that minimizes cost of fabrication of said IC.

23. A method as in claim 20, said optimized number of edge based image transfer shapes includes a set of shapes that optimizes IC performance.

24. A method as in claim 20, said edge based image transfer comprises one of sidewall image transfer and alternating phase shift mask.

25. A computer-readable storage medium having stored therein instructions for performing a method, the method comprising the steps of:

generating an edge based image transfer mask for fabrication of an optimized number of edge based image transfer shapes in an IC pattern comprising a plurality of IC shapes; generating a block mask that removes residual sections of said optimized number of edge based image transfer shapes; and, generating a lithography mask for fabrication of any remaining IC shapes in said IC pattern.

26. A computer-readable storage medium having stored therein instructions for performing a method, the method comprising the steps of:

generating an edge based image transfer mask for fabrication of an optimized number of edge based image transfer shapes in an IC pattern comprising a plurality of shapes;

selecting a set of edge based image transfer shapes in said plurality for said optimized number of edge based image transfer shapes in said IC pattern; and, iteratively reducing said set based upon errors in the said generation of said edge based image transfer shapes.

27. A computer-readable storage medium having stored therein instructions for performing a method, the method comprising the steps of:

generating an edge based image transfer mask for fabrication of an optimized number of edge based image transfer shapes in an IC pattern comprising a plurality of shapes;

selecting a set of edge based image transfer shapes in said plurality for said optimized number of edge based image transfer shapes in said IC pattern, each edge based image transfer shape in said set comprising a binary edge based image transfer manufacture option; and, selectively choosing a most favorable edge based image transfer binary manufacture option for each edge based image transfer shape, thereby creating a final set of edge based image transfer shapes.

28. A computer-readable storage medium having stored therein instructions for performing a method, the method comprising the steps of:

generating an edge based image transfer mask for fabrication of an optimized number of edge based image transfer shapes in an IC pattern comprising a plurality of IC shapes;

selecting a set of edge based image transfer shapes in said plurality for said optimized number of edge based image transfer shapes in said IC pattern; and, defining exclusion areas around said set of edge based image transfer shapes substantially preventing expansion of edge based image transfer shapes that would cause at least partial IC failure in response to edge based image expansion.

* * * * *